United States Patent
Chen et al.

(10) Patent No.: US 7,900,107 B2
(45) Date of Patent: Mar. 1, 2011

(54) HIGH SPEED ATPG TESTING CIRCUIT AND METHOD

(75) Inventors: Wang-Chin Chen, Kaohsiung County (TW); Augusli Kifli, Hsinchu (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 259 days.

(21) Appl. No.: 12/195,031

(22) Filed: Aug. 20, 2008

(65) Prior Publication Data

US 2010/0050030 A1 Feb. 25, 2010

(51) Int. Cl.
*G01R 31/28* (2006.01)
*G06F 11/00* (2006.01)

(52) U.S. Cl. .......... 714/729; 714/727; 714/734; 714/735

(58) Field of Classification Search .................. None
See application file for complete search history.

(56) References Cited

U.S. PATENT DOCUMENTS

| | | | | |
|---|---|---|---|---|
| 5,621,739 | A | * | 4/1997 | Sine et al. ............ 714/724 |
| 7,263,642 | B1 | * | 8/2007 | Makar et al. ......... 714/736 |
| 7,487,412 | B2 | * | 2/2009 | Baeg et al. ........... 714/712 |
| 2005/0055615 | A1 | | 3/2005 | Agashe et al. |
| 2005/0138501 | A1 | * | 6/2005 | Motika et al. ........ 714/724 |
| 2006/0248419 | A1 | * | 11/2006 | Colunga et al. ...... 714/727 |
| 2009/0132879 | A1 | * | 5/2009 | Gangappa ............. 714/729 |

* cited by examiner

*Primary Examiner* — Robert Beausoliel
*Assistant Examiner* — Guerrier Merant
(74) *Attorney, Agent, or Firm* — Winston Hsu; Scott Margo

(57) ABSTRACT

The invention provides an internal comparison circuits for speeding up the ATPG test. During test, an external test machine transfers original test patterns into at least one scan chain of a chip to be tested. A bi-directional output buffer of the chip also receives the test patterns from the test machine. A comparator of the chip compares the original test patterns from the test machine via the bi-directional output buffer group with scanned-out test patterns from the scan chain, to produce a comparison signal indicating whether the chip passes or fails the test.

10 Claims, 5 Drawing Sheets

HIGH SPEED ATPG TESTING CIRCUIT AND METHOD

BACKGROUND OF THE INVENTION

1. Field of Invention

The present invention relates to an Automatic Test Pattern Generator (ATPG) testing circuit and testing method for testing a IC chip, and, more particularly, to ATPG testing circuit and testing method at high testing speed.

2. Description of Related Art

An Automatic Test Pattern Generator (ATPG) is a software design tool that simulates the overall functionality of the design or individual circuits within the design of an integrated circuit and generates test vectors for testing the stuck at "0" or "1" overall circuit node of the design. Through the use of these test vectors, an Automatic Testing Equipment (ATE) sends the test vectors, created by ATPG, to the under test device (UTD) and observes the output of UTD to verify it has may provide a particular degree of fault coverage or fault simulation for the circuitry in the product. Specifically, automatic test pattern generation techniques provide test patterns for stuck-at faults, transition faults and path delay faults. The ATE is used in a manufacturing environment to test the die at wafer-level and in packaged tests. During testing of a die, test signals are provided through input or input/output (I/O) buffers on the die, and the test results are monitored on output or I/O buffers.

Testing of digital systems, such as the core logic of an integrated circuit, is typically performed by loading test patterns into scan chains in the system then capturing the logic values of combination logic between flip flop of scan chain. The captured information are shift out and compared by ATE.

FIG. 1 shows a conventional ATPG testing mechanism for testing a chip 100. As shown in FIG. 1, the chip to be tested 100 at least includes an output buffer 105 and at least one scan chain. The scan chain at least has a plurality of flip-flops 101 and a plurality of combinational logics 102a, 102b . . . . During test, the ATE 120 sends out ATPG test patterns to the chip 100. The ATPG test patterns are sequentially input into the combinational logics 102a, 102b . . . via the flip-flops 101, triggered by the scan clock scan-clk. After the combinational logics 102a, 102b . . . receive the ATPG test patterns, they will output a logic value to the back-stage flip-flop 101. Then, the logic values are sequentially output from the output buffer 105 to the ATE 120 via the load board 110. Then, the ATE 120 compares the received ATPG test patterns with the ATPG test patterns originally sent out to the chip 100. Based on the comparison result, the ATE 120 determines whether the chip 100 is pass or failed.

However, in tradition, the test speed of ATPG is limited by output buffer driving strength and by pin load of ATE. In other words, if driving strength of generic output buffer of IC chips is not enough or the pin load of ATE is heavy, the test speed of the ATE may not be high. Further, when the output buffer sends out the ATPG test patterns to the ATE, the output buffer will suffer from large loading which is caused by the load board 110 and the ATE 120.

For example, if driving strength of the output buffer 105 is 16 mA while the pin load of ATE is 87 p, then the maximum test clock frequency is about 31 MHz for full swing. Further, it takes time to transmit long ATPG patterns for testing.

The present invention is directed to overcoming, or at least reducing the effects of one or more of the problems set forth above.

SUMMARY OF THE INVENTION

The invention provides an ATPG test circuit and a test method for high speed ATPG shift-in and shift-out comparison, for reducing ATPG test time.

The invention provides an ATPG test circuit and a test method for high speed ATPG shift-in and shift-out comparison with low test cost.

The invention provides an ATPG test circuit and a test method for high speed ATPG shift-in and shift-out comparison, for improving shift-in and shift-out test operation frequency.

One example of the invention provides a chip with internal comparison circuits. The circuits at least includes: a scan chain group, having at least one scan chain, receiving test patterns from an external test machine and outputting scanned-out test patterns; a bi-directional output buffer group, coupled to the scan chain group and the test machine, under a first mode, the bi-directional output buffer group receiving the test patterns from the test machine, and under a second mode, the bi-directional output buffer group outputting the scanned-out test patterns from the scan chain group to the test machine; and a comparator group, coupled to the scan chain group and the bi-directional output buffer group, under the first mode, the comparator group receiving the test patterns from the test machine via the bi-directional output buffer group and receiving the scanned-out test patterns from the scan chain group to produce a comparison signal indicating whether the chip is passed or not.

Another example of the invention provides a testing method for testing a chip having a scan chain, a comparator and a bi-directional output buffer, the method comprising: providing original test patterns from a test machine external to the chip into the scan chain group; in response to the original test patterns, generating scanned-out test patterns from the scan chain group; under a first mode, receiving the original test patterns from the test machine via the bi-directional output buffer, comparing the original test patterns passed from the bi-directional output buffer with the scanned-out test patterns generated from the scan chain group by the comparator of the chip, to determine whether the chip passes or fails the test.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
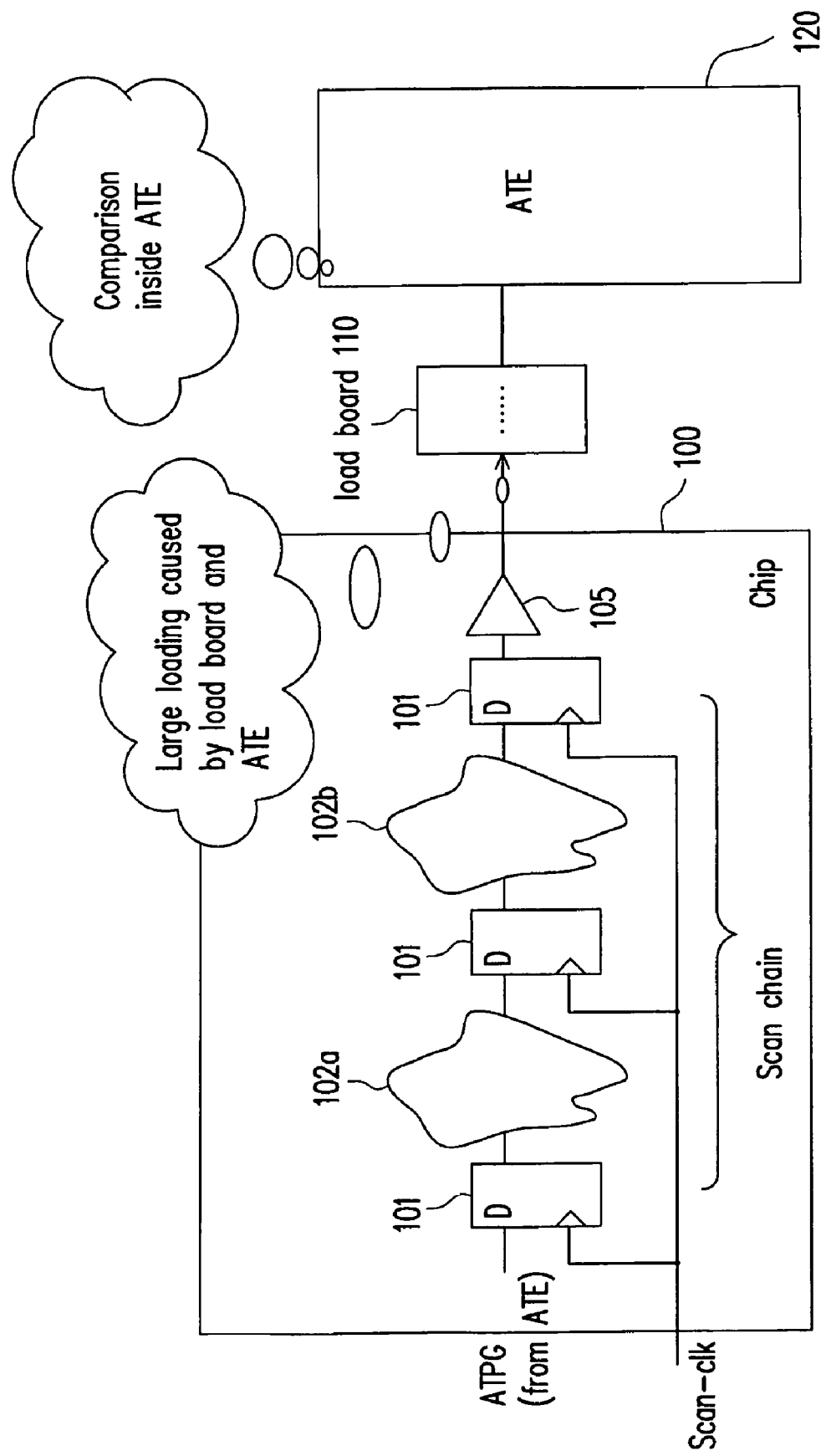
FIG. 1 shows a conventional ATPG testing mechanism for testing a chip 100.

Reference will now be made in detail to the present embodiments of the invention, examples of which are illustrated in the accompanying drawings. Wherever possible, the same reference numbers are used in the drawings and the description to refer to the same or like parts.

In embodiments of the invention, under high speed mode, the test patterns comparison is performed by the chip to be tested, rather than by the ATE; and under normal speed mode, the test patterns comparison is performed by the ATE. Therefore, under high speed mode, because the test patterns comparison is performed by the chip to be tested, the test speed is higher.

First Embodiment

Figure 2:
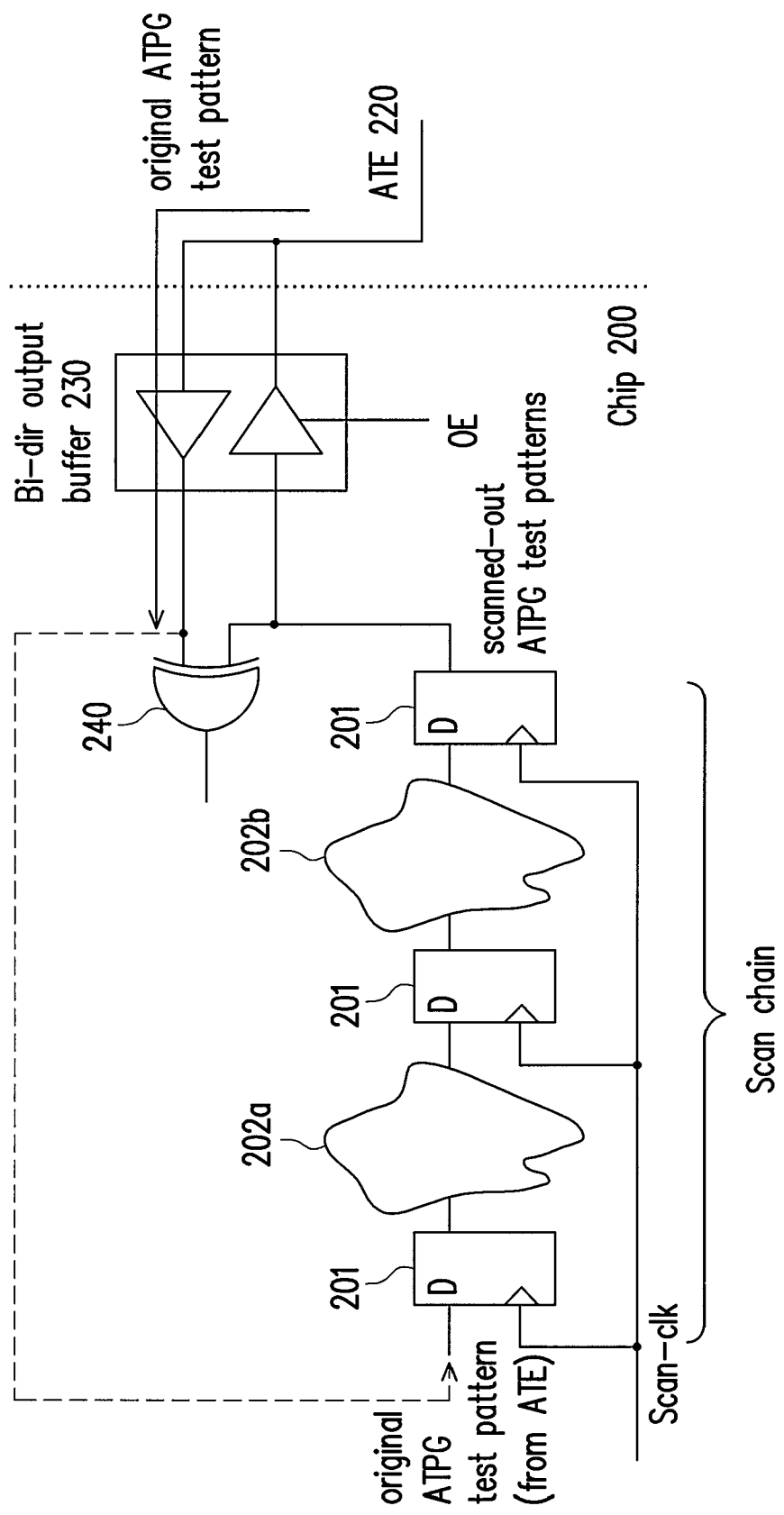
FIG. 2 shows a block diagram of the ATPG test circuit according to a first embodiment of the invention.

FIG. 2 shows a block diagram of the ATPG test circuit according to a first embodiment of the invention. As shown in FIG. 2, the chip to be tested 200 at least includes a bi-directional output buffer 230, a comparator 240 and at least one scan chain. The scan chain at least has a plurality of flip-flops 201 and a plurality of combinational logics 202a, 202b.

In the following, "shift-in" refers to sending of original ATPG test patterns from the ATE 220 to the chip 200; while "shift-out" refers to sending of scanned-out ATPG test patterns from the chip 200 to the ATE 220. "Original ATPG test patterns" refers to ATPG test patterns sent from the ATE 220 while "scanned-out ATPG test patterns" refers to ATPG test patterns sent from the scan chain of the chip 200.

The comparator 240 compares the original ATPG test patterns from the ATE 220 and the scanned-out ATPG test patterns from the scan chain of the chip 200, to determine whether the scan chain functions normally or not, i.e. to determine the chip 200 is passed or failed. The comparator 240 is for example but not limited to, an XOR logic gate.

Based on an output enable signal OE, operation mode of the bi-directional output buffer 230 is determined. For example, when the output enable signal OE is logic H, the bi-directional output buffer 230 outputs the scanned-out ATPG test patterns from the scan chain to the ATE 220, i.e. the bi-directional output buffer 230 is in output mode. On the other hand, when the output enable signal OE is logic L, the bi-directional output buffer 230 receives the original ATPG test patterns from the ATE 220, i.e. the bi-directional output buffer 230 is in input mode.

The configuration in FIG. 2 has two operation mode, high speed mode and normal speed mode. During high speed mode, the original ATPG test patterns are sent from the ATE 220 to the scan chain of the chip 200; and then the scan chain in the chip 200 provides the scanned-out ATPG test patterns to the comparator 240 for test patterns comparison. In other words, during high speed mode, the test patterns comparison is done by the chip 200 (i.e. the comparator 240 of the chip 200), rather than by the ATE 220. During normal speed mode, the scanned-out ATPG test patterns generated from the scan chain are scanned out via the bi-directional output buffer 230 to the ATE 220 so that the ATE 220 compares the scanned-out ATPG test patterns with the original ATPG test patterns to determine whether the chip 200 is passed or not. Further, under normal speed mode, the ATE 200 debugs the scan chain of the failed chip 200 based on the scanned-out ATPG test patterns.

Figure 3:
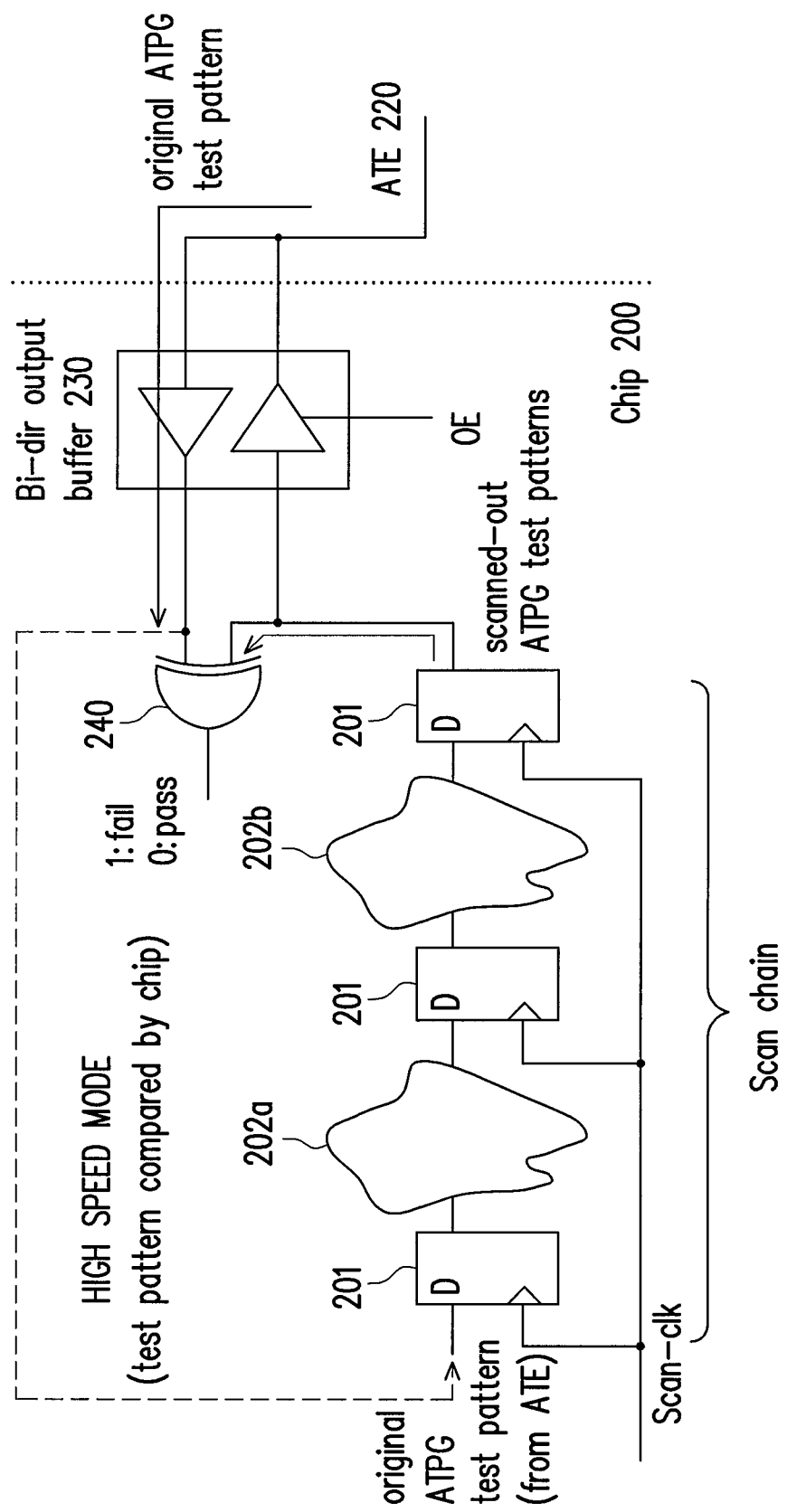
FIG. 3 shows the test circuit according to the first embodiment under high scan shift speed mode.

FIG. 3 shows the test circuit according to the first embodiment under high scan shift speed mode. As shown in FIG. 3, when the test circuit according to the first embodiment works under high scan shift speed mode, the bi-directional output buffer 230 is under input mode, i.e. the bi-directional output buffer 230 receives the original ATPG test patterns from the ATE 220 and then passes the original ATPG test patterns to the comparator 240.

After the scan chain of the chip 200 receives the original ATPG test patterns from the ATE 220, the scan chain provides scanned-out ATPG test patterns to the comparator 240. So, the comparator 240 may compare the original ATPG test patterns from the ATE 220 and the scanned-out ATPG test patterns from the scan chain. If the comparison result indicates that the original ATPG test patterns matches with the scanned-out ATPG test patterns, then the chip 200 is determined as passed. On the contrary, if the comparison result indicates that the original ATPG test patterns do not match with the scanned-out ATPG test patterns, then the chip 200 is determined as failed.

As shown in FIG. 3, because the test pattern comparison is done inside the chip 200, the chip 200 does not have to send the scanned-out test patterns out from the chip 200 to the ATE 220 during high scan shift speed test. In other words, during testing under high scan shift speed mode, the chip 200 does not suffer from heavy load of the ATE and the load board. Therefore, the test speed of the test circuit according to the first embodiment under high scan shift speed mode is not limited by output buffer driving strength and by pin load of ATE. Even if driving strength of output buffers of IC chips is not enough or the pin load of ATE is heavy, the test speed of the ATE does not have to be lowered. Therefore, the maximum test clock frequency is higher, compared with the prior art.

Figure 4:
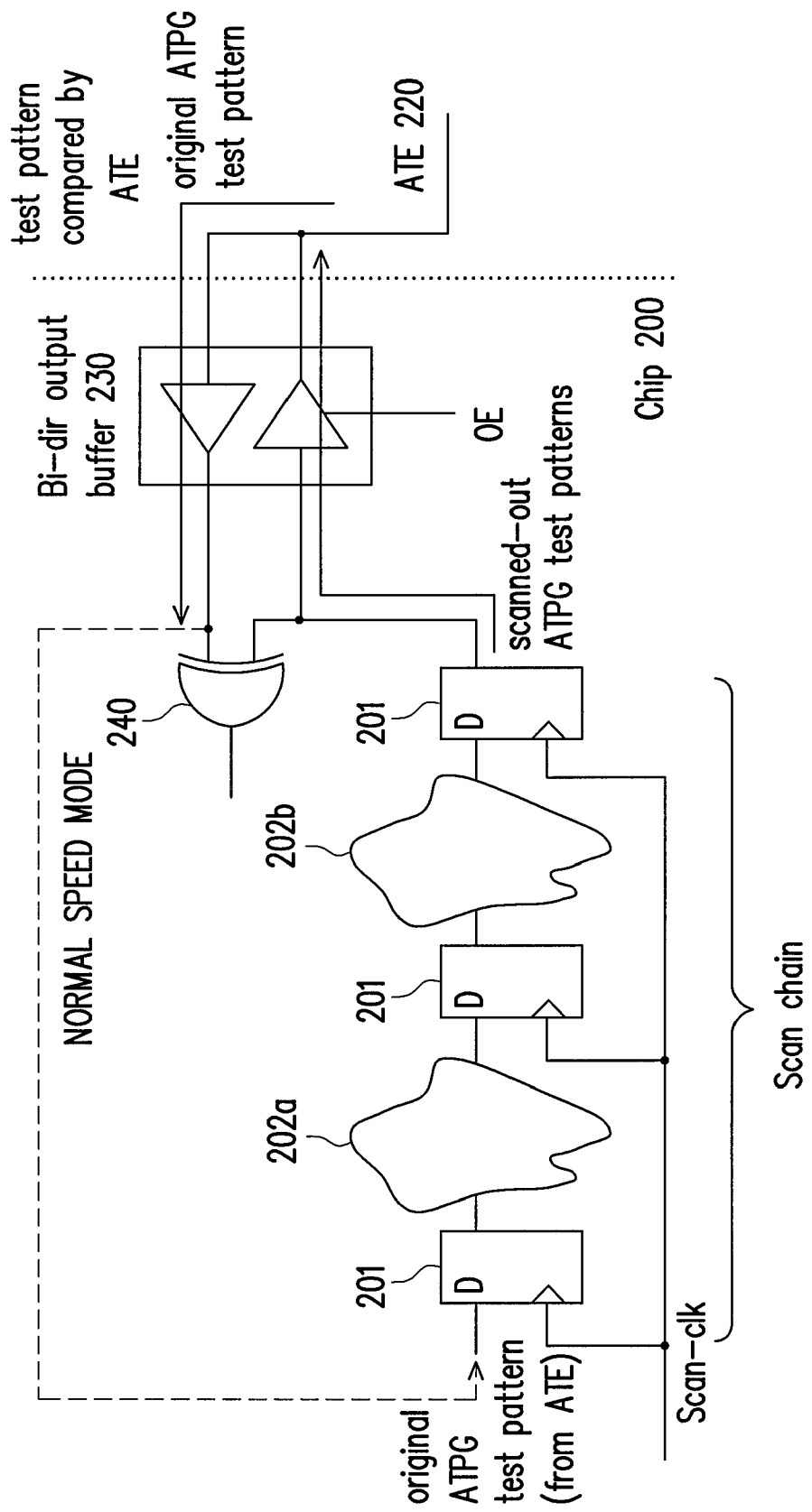
FIG. 4 shows the test circuit according to the first embodiment under normal scan shift speed mode.

FIG. 4 shows the test circuit according to the first embodiment under normal scan shift speed mode. As shown in FIG. 4, when the test circuit according to the first embodiment works under normal scan shift speed mode, the bi-directional output buffer 230 is under output mode, i.e. the bi-directional output buffer 230 sends out the scanned-out ATPG test patterns from the scan chain of the chip 200 to the ATE 220.

After the scan chain of the chip 200 receives the original ATPG test patterns from the ATE 220, the scan chain provides scanned-out ATPG test patterns to the bi-directional output buffer 230. So, the ATE 220 may compare the original ATPG test patterns and the scanned-out ATPG test patterns from the bi-directional output buffer 230. If the comparison result indicates that the original ATPG test patterns matches with the scanned-out ATPG test patterns, then the chip 200 is determined as passed. On the contrary, if the comparison result indicates that the original ATPG test patterns do not match with the scanned-out ATPG test patterns, then the chip 200 is determined as failed.

Under normal scan shift speed mode, if the ATE 220 determines the chip is failed, then the ATE 220 may debug by analyzing the scan-out ATPG test patterns.

Second Embodiment

Figure 5:
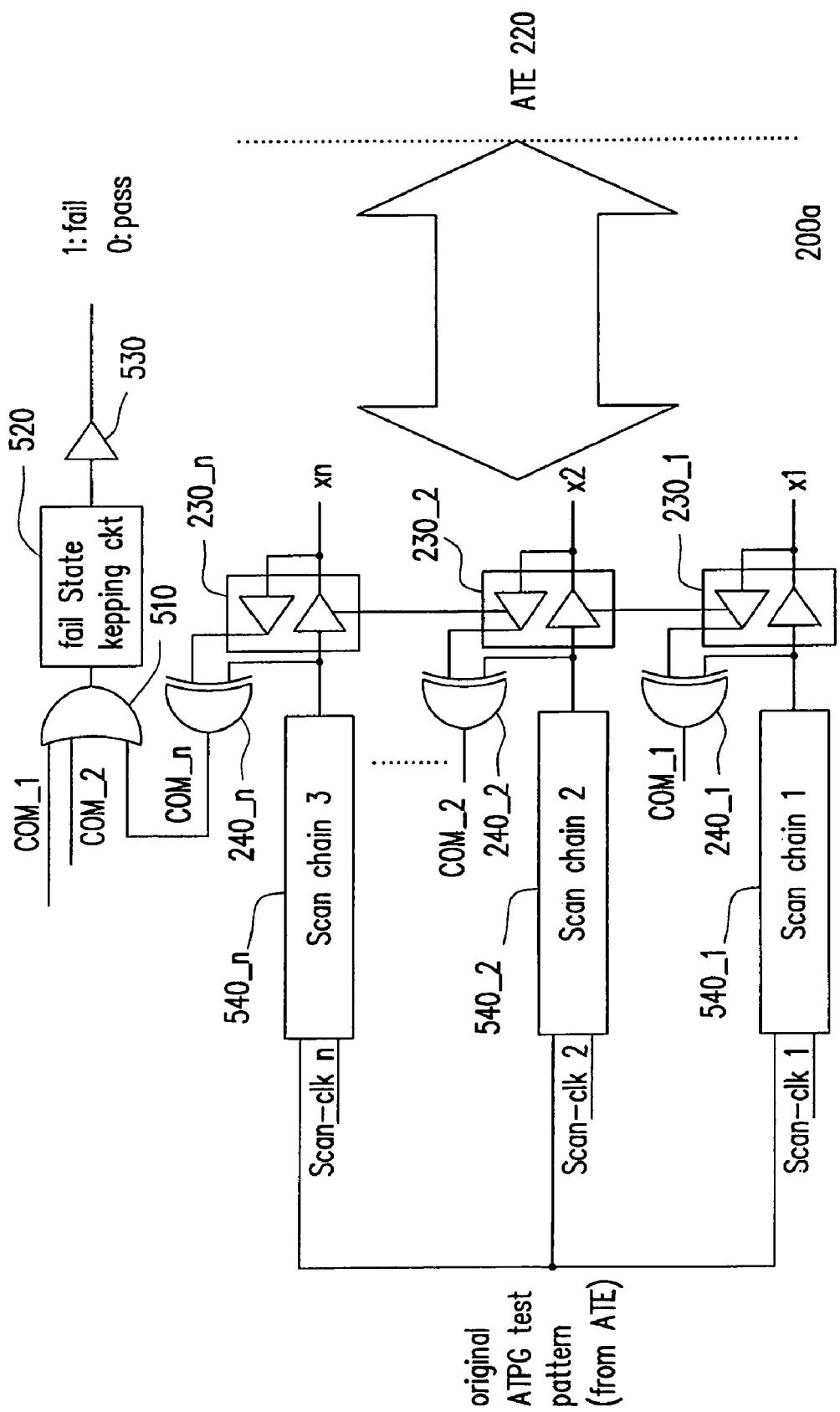
FIG. 5 shows a block diagram of the ATPG test circuit according to a second embodiment of the invention.

FIG. 5 shows a block diagram of the ATPG test circuit according to a second embodiment of the invention. As shown in FIG. 5, the chip to be tested 200a at least includes a plurality of bi-directional output buffers 230_1~230_n, a plurality of comparators 240_1~240_n, a plurality of scan chains 540_1~540_n, a logic 510, a fail state keeping circuit 520 and an buffer 530. The scan chains 540_1~540_n may have a plurality of flip-flops and a plurality of combinational logics.

Similar with FIG. 2, the circuit configuration in FIG. 5 also has two operation mode, high speed mode and normal speed mode. Under high speed mode, the comparators 240_1~240_n compare the original ATPG test patterns with the scanned-out ATPG test patterns from the scan chains 540_1~540_n to produce comparison signals COM_1~COM_n. If the comparison signal is 1, then the corresponding scan chain is failed and vice versa.

The comparison signals COM_1~COM_n from the comparators 240_1~240_n are input into the logic gate 510. The logic gate 510 is for example but not limited by an OR logic gate. If at least one of the comparison signals COM_1~COM_n is logic 1, which means if at least one of the scan chains 540_1~540_n is failed, then the logic gate 510 outputs logic 1.

The fail state keeping circuit 520 is used to keep output of the logic gate 510 and the buffer 530 is for outputting the output of the logic gate 510. So, via checking the output of the buffer 530, whether the chip 200a is passed or failed is determined.

Further, if the chip 200a is determined as being failed, then the ATPG test patterns may be terminated, i.e. the ATE 220 may stop sending the original ATPG test patterns to the chip 200a and monitoring of the output from the output buffer 530 may be terminated too.

Still further, if the chip 200a is determined as being failed, then the corresponding scanned-out ATPG test patters may be output from pins x1~xn to the ATE 220. So, by debugging the corresponding scanned-out ATPG test patterns, failed scan chains may be identified.

Still further, if the chip 200a is determined as being failed, then the failed chip 200a is discarded.

In brief, in the above embodiment, there are two test modes. Under high speed mode, the bi-directional output buffer is programmed as input mode and the test patterns comparison is performed by internal components of the chip to be tested, so that the test speed is high. Under normal speed mode, the bi-directional output buffer is programmed as output mode and the test patterns comparison is performed by the ATE, so that the test speed is normal.

In the above embodiments of the invention, under high speed mode, the maximum test speed is limited by operation speed of the ATE and the timing of the scan chain. Further, the overhead is very small because only several logic gates (OR gates and/or XOR gates) are newly added.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A chip with internal comparison circuits, comprising: a scan chain group, having at least one scan chain, receiving test patterns from an external test machine and outputting scanned-out test patterns; a bi-directional output buffer group, coupled to the scan chain group and the test machine, under a first mode, the bi-directional output buffer group receiving the test patterns from the test machine, and under a second mode, the bi-directional output buffer group outputting the scanned-out test patterns from the scan chain group to the test machine; and a comparator group, coupled to the scan chain group and the bi-directional output buffer group, under the first mode, the comparator group receiving the test patterns from the test machine via the bi-directional output buffer group and receiving the scanned-out test patterns from the scan chain group to produce a comparison signal indicating whether the chip is passed or not Wherein the first mode is a high speed mode and the second mode is a normal speed mode.

2. The chip with internal comparison circuits of claim 1, wherein the bi-directional output buffer group is controlled by an output enable signal.

3. The chip with internal comparison circuits of claim 2, wherein:
the bi-directional output buffer group is under the first mode, when the output enable signal is of a first value; and
the bi-directional output buffer group is under the second mode, when the output enable signal is of a second value.

4. The chip with internal comparison circuits of claim 1, wherein the scan chain of the scan chain group at least includes a plurality of flip-flops and a plurality of combinational logics.

5. The chip with internal comparison circuits of claim 1, wherein:
the scan chain group includes a plurality of parallel scan chains;
the bi-directional output buffer group includes a plurality of bi-directional output buffers; and
the comparator group includes a plurality of comparators.

6. The chip with internal comparison circuits of claim 5, further including:
a logic gate, for receiving outputs from the comparators of the comparator group and outputting a signal for indicating whether at least one of the scan chains is failed or not; and
a state keeping circuit, for keeping the output signal of the logic gate.

7. The chip with internal comparison circuits of claim 5, wherein the test patterns from the test machine and the scanned-out test patterns from the scan chain group are both ATPG test patterns.

8. A testing method for testing a chip having a scan chain, a comparator and a bi-directional output buffer, the method comprising: providing original test patterns from a test machine external to the chip into the scan chain group; in response to the original test patterns, generating scanned-out test patterns from the scan chain group; under a first mode, receiving the original test patterns from the test machine via the bi-directional output buffer, comparing the original test patterns passed from the bi-directional output buffer with the scanned-out test patterns generated from the scan chain group by the comparator of the chip, to determine whether the chip is failed or not Wherein the first mode is a high speed mode and the second mode is a normal speed mode.

9. The testing method of claim 8, further comprising:
under a second mode, outputting the scanned-out test patterns generated from the scan chain group via the bi-directional output buffer to the test machine so that the test machine compares the scanned-out test patterns with the original test patterns to determine whether the chip passes or fails the test.

10. The testing method of claim 8, wherein the test patterns from the test machine and the scanned-out test patterns from the scan chain group are both ATPG test patterns.

* * * * *